(12) United States Patent
Ogawara et al.

(10) Patent No.: US 6,405,436 B1
(45) Date of Patent: Jun. 18, 2002

(54) METHOD OF PRODUCING COOLING FAN ATTACHED TYPE HEAT SINK

(75) Inventors: Toshiki Ogawara; Yuichi Kodaira; Haruhisa Maruyama, all of Tokyo (JP)

(73) Assignee: Sanyo Denki Co., Ltd., Tokyo (JP)

( * ) Notice: Subject to any disclaimer, the term of this patent is extended or adjusted under 35 U.S.C. 154(b) by 0 days.

(21) Appl. No.: 09/650,326

(22) Filed: Aug. 29, 2000

(30) Foreign Application Priority Data

Sep. 30, 1999  (JP) .......................................... 11-279249

(51) Int. Cl.[7] ................................................ B23P 15/26
(52) U.S. Cl. ...................................... 29/890.03; 29/558
(58) Field of Search ............................. 29/840.03, 557, 29/558, 428

(56) References Cited

U.S. PATENT DOCUMENTS

| | | | | |
|---|---|---|---|---|
| 4,175,308 A | * | 11/1979 | Togashi | 29/890.03 |
| 4,879,891 A | * | 11/1989 | Hinshaw | 72/254 |
| 4,884,331 A | * | 12/1989 | Hinshaw | 29/558 |
| 5,406,698 A | * | 4/1995 | Lipinski | 29/727 |
| 5,428,897 A | * | 7/1995 | Jordan et al. | 29/890.03 |
| 5,711,069 A | * | 1/1998 | Hundt | 29/890.03 |
| 6,189,363 B1 | * | 2/2001 | Lai | 72/358 |
| 6,202,303 B1 | * | 3/2001 | Trobough | 29/890.03 |

FOREIGN PATENT DOCUMENTS

JP        11-284116         10/1999

* cited by examiner

Primary Examiner—I Cuda-Rosenbaum
(74) Attorney, Agent, or Firm—Rankin, Hill, Porter & Clark LLP

(57) ABSTRACT

A heat sink preform having a base 2, a fan case engagement portion 3 and a radiating fin formation portion is integrally formed by extrusion molding. A plurality of radiating fins 5 having a tong ratio which is defined as a ration of the height of the radiating fins with respect to the interval dimension between neighboring radiating fins of more than or equal to 10 is formed by subjecting the radiating fin formation portion to cutting work. In this way, a cooling fan attached type heat sink with a plurality of radiating fins having a shape that is difficult to be formed or cannot be formed or having a large tong ratio can be produced with low costs and with relative ease.

9 Claims, 3 Drawing Sheets

METHOD OF PRODUCING COOLING FAN ATTACHED TYPE HEAT SINK

BACKGROUND OF THE INVENTION

1. Field of the Invention

The present invention relates to a method of producing a cooling fan attached type heat sink used in an electronic component cooling apparatus for cooling electronic components such as a MPU (micro processor unit).

2. Description of the Related Art

FIGS. 5 and 6 are a plan view and a side view of an electronic component cooling apparatus using a conventional general cooling fan attached type heat sink marketed and manufactured by the present applicant. This electronic component cooling apparatus is pending for patent under the publication No. JP-A 10-86491 (1998) (U.S. patent application Ser. No. 09/190,872). As shown in FIGS. 5 and 6, this electronic component cooling apparatus consists of combination of a heat sink 101 and a cooling fan 102. The heat sink (cooling fan attached type heat sink) 101 attached to the cooling fan 102 comprises a base 103 to which an electronic component is to be mounted, a plurality of radiating fins 104 provided for the base 103 and a fan case engagement portion 106 for engagement with a fan case 105 of the cooling fan 102. In this example, the cooling fan attached type heat sink 101 is formed by subjecting an extrusion obtained by extrusion molding to cutting or punching work. Heat sinks used for this type of electronic component cooling apparatus are sometimes formed by casting or forging depending on their shapes.

In a cooling fan attached type heat sink, it is desired to increase the number of plural radiating fins and thereby improve the radiating effect without hindering miniaturization of the heat sink. However, in addressing such desires, the ratio of the height H of the radiating fins with respect to the interval dimension G between neighboring radiating fins (tong ratio: H/G) becomes large, which makes molding, for instance, by extrusion molding difficult. Particularly, when the tong ratio is more than or equal to 10, it is impossible to form the plurality of radiating fins by extrusion molding. Moreover, there are limitations for shapes of the radiating fins that can be formed by casting and forging.

It is an object of the invention to provide a method of producing a cooling fan attached type heat sink with a plurality of radiating fins having a shape that is difficult to be formed or cannot be formed by casting, forging or extrusion molding with low costs and with relative ease.

SUMMARY OF THE INVENTION

In one aspect, the present invention aims at improving a method of producing a cooling fan attached type heat sink comprising a base, a plurality of radiating fins provided for the base and a fan case engagement portion for engagement with a fan case of a cooling fan for forcefully cooling the base. According to the present invention, at first, a heat sink preform having a base, a fan case engagement portion and a radiating fin formation portion in which a plurality of radiating fins are to be formed is integrally formed by casting, forging or extrusion molding. Next, a plurality of radiating fins having such a shape that is difficult to be formed or cannot be formed by casting, forging or extrusion molding or having a large tong ratio is formed by subjecting the radiating fin formation portion to cutting work.

In the cutting work step, the cutting work can be effected so that a tong ratio that is defined as a ratio of the height of the radiating fins with respect to the interval dimension of neighboring radiating fins is more than or equal to 10.

Further, the heat sink preform can be formed of metals having high heat conductivity such as aluminum, copper and the like.

In another aspect, the present invention aims at improving a method of producing a cooling fan attached type heat sink comprising a base, a plurality of radiating fins provided for the base and a fan case engagement portion for engagement with a fan case of a cooling fan for forcefully cooling the base. The present invention comprises the steps of: forming a heat sink preform by casting, forging or extrusion molding, the preform having a base, a fan case engagement portion and a fin fixation portion to which a plurality of radiating fins is to be fixed; and fixing a plurality of radiating fins having such a shape that is difficult to be formed or cannot be formed by casting, forging or extrusion molding or having a large tong ratio to the fin fixation portion of the heat sink preform.

The plurality of radiating fins can be configured as a radiating fin unit in which any two neighboring radiating fins of the plurality of radiating fins arranged side by side are connected via a connecting portion.

The radiating fin unit can be integrally formed of a material having a heat conductivity higher than that of the heat sink preform.

In the fin fixation portion of the heat sink preform is provided a plurality of positioning grooves for positioning the radiating fin unit, so that it is possible to fix the radiating fin unit to the fin fixation portion with the plurality of connecting portions located on one side of the radiating fin unit being fitted into the plurality of positioning grooves.

DETAILED DESCRIPTION OF THE PREFERRED EMBODIMENTS

Figure 1:
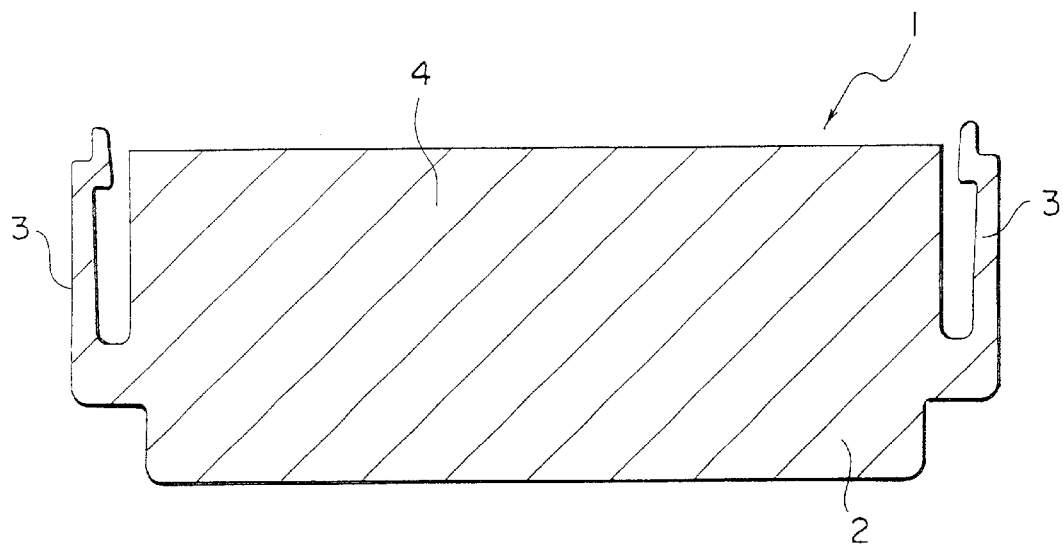
FIG. 1 is a section view of a heat sink preform used for explaining a production method which is one embodiment of the present invention.
Figure 2:
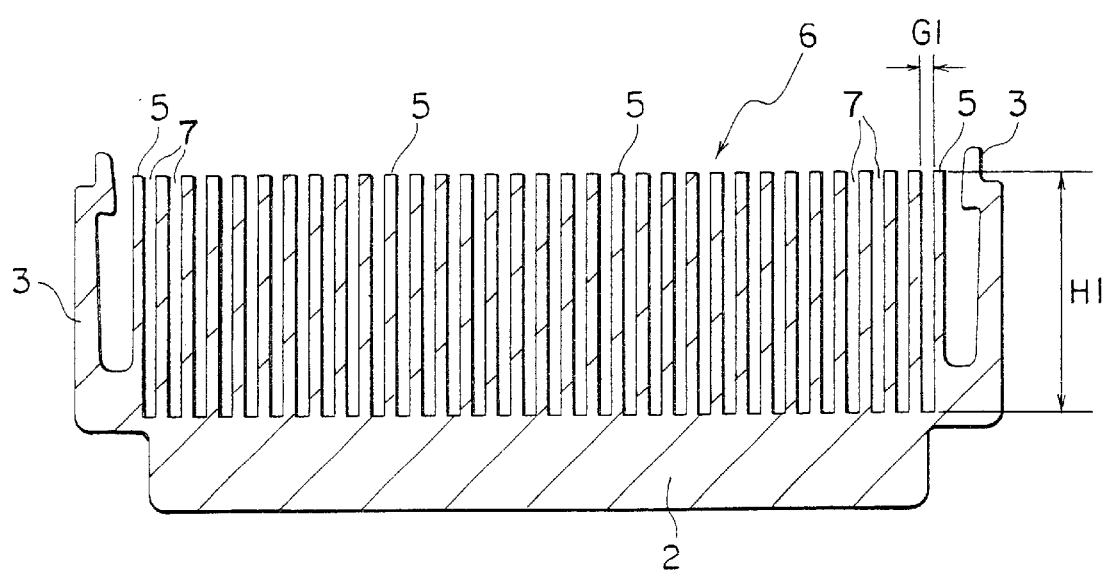
FIG. 2 is a section view of a cooling fan attached type heat sink produced by the method of one embodiment of the present invention.
Figure 5:
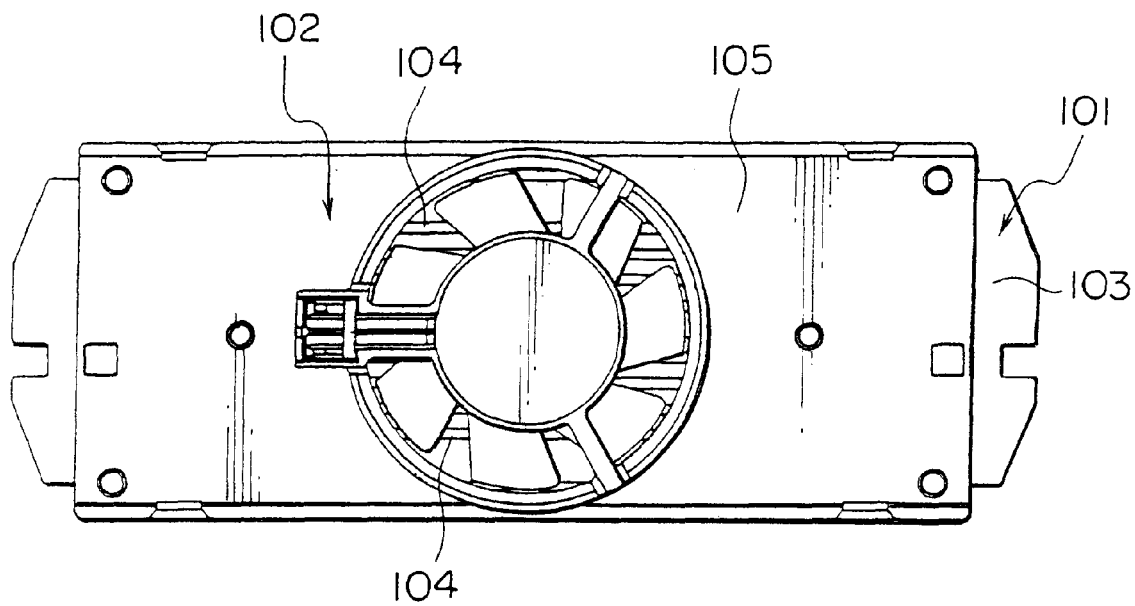
FIG. 5 is a plan view of an electronic component cooling apparatus employing a general cooling fan attached type heat sink manufactured and marketed by the present applicant.
Figure 6:
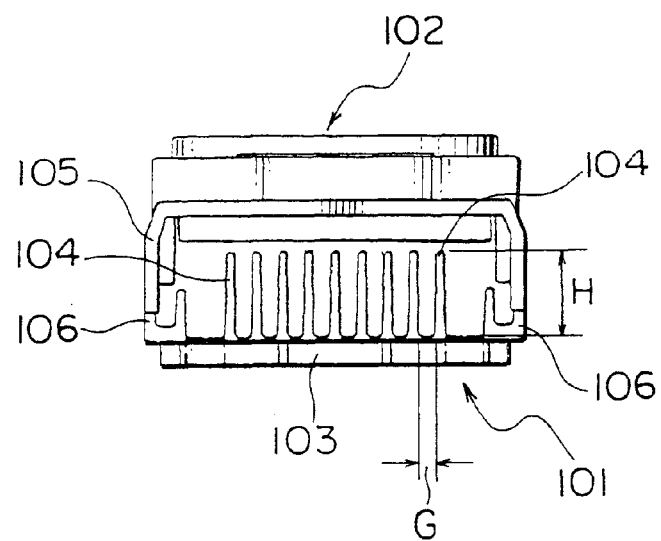
FIG. 6 is a side view of the electronic component cooling apparatus employing a general cooling fan attached type heat sink manufactured and marketed by the applicant.

In the following, a method of producing a cooling fan attached type heat sink which is one embodiment of the present invention will be described with reference to the drawings. First of all, a heat sink preform 1 of aluminum having a cross sectional shape of FIG. 1 is formed by extrusion molding. This heat sink preform 1 has a base 2 to which an electronic component is to be mounted, fan case engagement portions 3,3 for engagement with a fan case of a cooling fan and a radiating fin formation portion 4 of a substantially rectangular parallelepiped formed in the base 2 as an integrated piece, and has the same sectional shape as that of the cooling fan attached type heat sink 101 shown in FIGS. 5 and 6 except for the radiating fin formation portion 4. The fan case engagement portions 3,3 and the radiating fin formation portions 4 extend continuously in the direction of extrusion. Next, after subjecting the heat sink preform 1 to predetermined works such as cutting and punching, a plurality of grooves 7 extending in the direction of extrusion is formed by cutting work in the radiating fin formation portion 4 with the use of a NC machine tool, thereby completing a cooling fan attached type heat sink 6 with a plurality of radiating fins 5 having a cross sectional shape shown in FIG. 2. The plurality of radiating fins 5 is designed to have a ratio between the height H1 of the radiating fins 5 and the interval dimension G1 between neighboring radiating fins 5, 5 (tong ratio: H1/G1) of more than or equal to 10 and to have a shape that cannot be formed by extrusion molding.

According to the present embodiment, by subjecting the heat sink preform 1 formed by extrusion molding to cutting work, it is possible to produce the cooling fan attached type heat sink with the plurality of radiating fins 5 having such a shape that cannot be formed by extrusion molding. Moreover, in the present production method, since the extrusion molding is employed for the basic process of production, it is possible to produce the cooling fan attached type heat sink with low costs and with relative ease. The cutting work is not limited to the case that uses the NC machine tool, but any known cutting techniques can be used.

Figure 3:
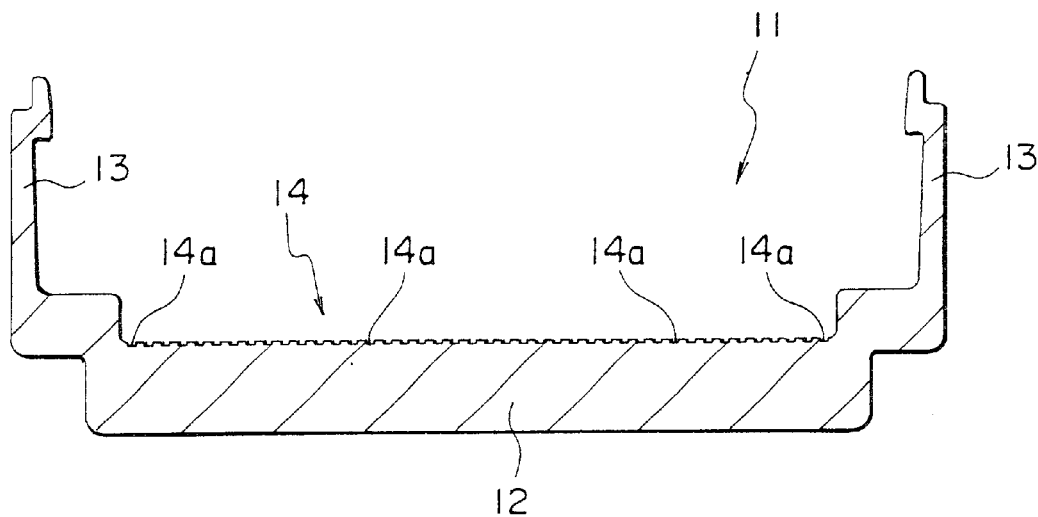
FIG. 3 is a section view of a heat sink preform used for explaining a production method which is another embodiment of the present invention.
Figure 4:
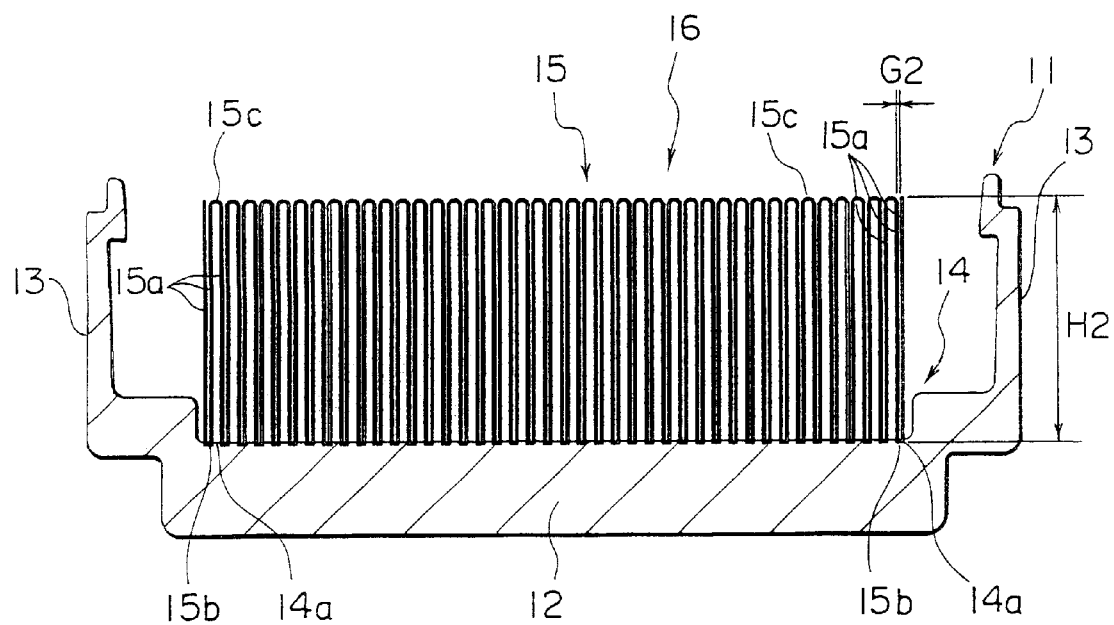
FIG. 4 is a section view o f a cooling fan attached type heat sink produced by the method of another embodiment of the present invention.

Next, a method of producing a cooling fan attached type heat sink which is another embodiment of the present invention will be described. First of all, an aluminum heat sink preform 11 having a cross sectional shape shown in FIG. 3 is formed by extrusion molding. This heat sink preform 11 has a base 12, fan case engagement portions 13, 13 and a fin fixation portion 14 formed in the base 12. The fin fixation portion 14 is formed with a plurality of positioning grooves 14a extending in the direction of extrusion of the heat sink preform 11. Secondly, a radiating fin unit 15 shown in FIG. 4 is prepared. The configuration of the radiating fin unit 15 will be detailed later. Thirdly, a plurality of connecting portions 15b located on one side of the radiating fin unit 15 is fitted into the plurality of positioning grooves 14a, thereby connecting the radiating fin unit 15 to the fin fixation portion 14 of the heat sink preform 11. The plurality of positioning grooves 14a thus formed makes it possible to fix the radiating fin unit 15 at a proper position with respect to the heat sink preform 11. Finally, the radiating fin unit 15 is fixed to the fin fixation portion 14 by using a welding or deposition technique, thereby completing a cooling fan attached type heat sink 16. The radiating fin unit 15 is formed of a material (such as copper) having a heat conductivity higher than that of the heat sink preform. Therefore, the cooling fan attached type heat sink 16 achieves high radiating efficiency. The radiating fin unit 15 is so configured that two neighboring radiating fins 15a, 15a of the plurality of radiating fins 15a arranged side by side are connected via connecting portions 15b, 15c. In other words, the radiating fin unit 15 has a so-called accordion shape resulted from bending of a single copper plate. By using such radiating fin unit 15, it is possible to fix the plurality of radiating fins 15a with respect to the base 12 easily by just fixing one radiating fin unit 15 to the fin fixation portion 14. Similar to the radiating fins 5 shown in FIG. 2, the radiating fins 15a of the radiating fin unit 15 are designed to have a ratio between the height H2 of the radiating fins 15a and the interval dimension G2 between neighboring radiating fins 15a, 15a (tong ratio: H2/G2) of more than or equal to 10 and to have a shape that cannot be formed by extrusion molding. Therefore, according to the present embodiment, by fixing the radiating fin unit 15 to the heat sink preform 11 formed by extrusion molding, it is possible to produce the cooling fan attached type heat sink with the plurality of radiating fins 15a having a shape that cannot be formed by extrusion molding.

Furthermore, in the present embodiment, the plurality of radiating fins 15a is provided for the base 12 by fixing the accordion-like radiating fin unit to the fin fixation portion 14 of the heat sink preform 11, however, a plurality of radiating fins in separated form may be fixed to the fin fixation portion 14 of the base 12.

Further, in the above-mentioned embodiments, examples were made that the heat sink preform is formed by extrusion molding, however, it goes without saying that the production methods according to the present invention may be applied to the case where the heat sink preform is formed by casting or forging, as well as extrusion molding.

According to the present invention, it is possible to produce a cooling fan attached type heat sink with a plurality of radiating fins having a shape that is difficult to be formed or cannot be formed by casting, forging or extrusion molding. Particularly, according to the present invention, since casting, forging or extrusion molding is used for the basic process of production, there arises the advantage that a cooling fan attached type heat sink can be produced with low costs and with relative ease.

What is claimed is:

1. A method of producing a cooling fan attached type heat sink comprising a base, a plurality of radiating fins provided for the base, a fan case engagement portion for engagement with a fan case of a cooling fan for forcefully cooling the plurality of radiating fins and the base, the method comprising the steps of:

forming a heat sink preform by casting, forging or extrusion molding, the heat sink preform having the base, the fan case engagement portion and a fin fixation portion for fixing the plurality of radiating fins; and fixing the plurality of radiating fins having a shape that is difficult to be formed or cannot be formed by casting, forging or extrusion molding or having a large tong ratio to the fin fixation portion of the heat sink preform, wherein the plurality of radiating fins are configured as a radiating fin unit in which any two neighboring radiating fins of the plurality of radiating fins arranged side by side are connected by a connecting portion so that the radiating fin unit is formed in an accordion shape.

2. The method of producing a cooling fan attached type heat sink according to claims 1, wherein the radiating fin unit is integrally formed of a material having a heat conductivity higher than that of the heat sink preform.

3. The method of producing a cooling fan attached type heat sink according to claim 1, wherein a plurality of positioning grooves for positioning the radiating fin unit are formed in the fin fixation portion of the heat sink preform, and the radiating fin unit is fixed to the fin fixation portion with the plurality of connecting portions located on one side of the radiating fin unit being fitted into the plurality of positioning grooves.

4. A method of producing a cooling fan attached type heat sink comprising the steps of;

forming a heat sink preform by extrusion molding, the heat sink preform having a base to which an electronic component is to be mounted, a fan case engagement portion for engagement with a fan case of a cooling fan and a fin fixation portion formed in the base and having a plurality of positioning grooves extending in the direction of the extrusion as an integrated piece;

preparing a radiating fin unit of an accordion shape by bending a metal plate formed of a material having a heat conductivity higher than that of the heat sink preform, the radiating fin unit having a plurality of radiating fins and a plurality of connecting portions for connecting two neighboring radiating fins; and attaching the plurality of connecting portions to the fin fixation portion of the heat sink preform by means of a welding or deposition technique with the plurality of connecting portions located on one side of the radiating fin unit being fitted into the plurality of positioning grooves.

5. The method of producing a cooling fan attached type heat sink according to claim 4, wherein a tong ration defined as a ration of the height of the radiating fins with respect to the interval dimension between neighboring radiating fins in the radiating fin unit is more than or equal to 10.

6. The method of producing a cooling fan attached type heat sink according to claim 4, wherein the heat sink preform is formed of aluminum, and the radiating fin unit is formed of a copper plate.

7. A method of producing a cooling fan attached type heat sink comprising a base, a radiation fin unit provided for the base, a fan case engagement portion for engagement with a fin case of a cooling fan for forcefully cooling the plurality of radiating fins and the base, the method comprising the steps of:

forming a heat sink preform by casting, forging or extrusion molding, the heat sink preform having the base, the fan case engagement portion and a fin fixation portion;

forming a plurality of radiating fins such that any two neighboring radiating fins arranged side by side are connected by a connecting portion to form the radiating fin unit having an accordion shape; and affixing the radiating fin unit to the fin fixation portion of the heat sink perform.

8. The method of producing a cooling fan attached type heat sink according to claim 7, wherein the radiating fin unit is integrally formed of a material having a heat conductivity higher than that of the heat sink preform.

9. The method of producing a cooling fan attached type heat sink according to claim 7, comprising the further step of:

forming a plurality of positioning grooves for positioning the radiating fin unit in the fin fixation portion of the heat sink preform, and fixing the radiating fin unit to the fin fixation portion with the plurality of connecting portions located on one side of the radiating fin unit being fitted into the plurality of positioning grooves.

* * * * *

UNITED STATES PATENT AND TRADEMARK OFFICE
CERTIFICATE OF CORRECTION

PATENT NO. : 6,405,436 B1
DATED : June 18, 2002
INVENTOR(S) : Ogawara et al.

It is certified that error appears in the above-identified patent and that said Letters Patent is hereby corrected as shown below:

<u>Column 4,</u>
Line 46, delete "perform" and insert --preform --.

<u>Column 6,</u>
Line 1, delete "fin" and insert -- fan --.
Line 14, delete "perform" and insert -- preform --.

Signed and Sealed this

Twentieth Day of August, 2002

*Attest:*

*Attesting Officer*

JAMES E. ROGAN
*Director of the United States Patent and Trademark Office*